(12) United States Patent
Yamamoto et al.

(10) Patent No.: US 7,522,001 B2
(45) Date of Patent: Apr. 21, 2009

(54) POWER AMPLIFIER

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 11 days.

(21) Appl. No.: 11/946,931

(22) Filed: Nov. 29, 2007

(65) Prior Publication Data
US 2009/0051437 A1 Feb. 26, 2009

(30) Foreign Application Priority Data
Aug. 23, 2007 (JP) ............................... 2007-217269

(51) Int. Cl.
*H03G 3/10* (2006.01)
(52) U.S. Cl. .................. 330/285; 330/296; 330/288
(58) Field of Classification Search .............. 330/285, 330/296, 288
See application file for complete search history.

(56) References Cited

U.S. PATENT DOCUMENTS

| | | | | |
|---|---|---|---|---|
| 6,198,347 | B1* | 3/2001 | Sander et al. | 330/251 |
| 6,566,954 | B2* | 5/2003 | Miyazawa | 330/285 |
| 6,750,718 | B2 | 6/2004 | Moriwaki et al. | |
| 6,753,734 | B2* | 6/2004 | Arell et al. | 330/296 |
| 6,816,017 | B2* | 11/2004 | Yamashita et al. | 330/298 |
| 6,842,075 | B2* | 1/2005 | Johnson et al. | 330/296 |
| 6,922,107 | B1* | 7/2005 | Green | 330/296 |
| 6,946,913 | B2 | 9/2005 | Moriwaki et al. | |
| 7,417,507 | B2* | 8/2008 | Yamamoto et al. | 330/296 |

| | | |
|---|---|---|
| 2007/0115062 | A1 | 5/2007 Yamamoto et al. |

FOREIGN PATENT DOCUMENTS

| | | |
|---|---|---|
| EP | 1 515 434 A1 | 3/2005 |
| JP | 2002-9558 | 1/2002 |
| JP | 2002-330030 | 11/2002 |
| JP | 2003-051720 | 2/2003 |
| JP | 2003-229728 | 8/2003 |
| JP | 2004-40500 | 2/2004 |
| JP | 2004-343244 | 12/2004 |
| JP | 2006-67379 | 3/2006 |
| JP | 2007-134768 | 5/2007 |

OTHER PUBLICATIONS

Biranchinath Sahu, "A High-Efficiency Linear RF Power Amplifier With a Power-Tracking Dynamically Adaptive buck-Boost Supply", IEEE Transactions on Microwave Theory and Techniques, vol. 52, No. 1 (2004).
Kim et al., "A 45% PAE/18mA Quiscent Current CDMA PAM with a Dynamic Bias Control Circuit", 2004 IEEE Radio Frquency Integrated Circuits (RFIC) Symposium (2004).

* cited by examiner

*Primary Examiner*—Patricia Nguyen
(74) *Attorney, Agent, or Firm*—Leydig, Voit & Mayer, Ltd.

(57) ABSTRACT

An emitter follower circuit applies to an input terminal of a second amplifying device a voltage according to a reference voltage applied to a reference terminal. First and second resistors are connected in series between the reference terminal and an input terminal of a first amplifying device. The collector of a first transistor is connected to the reference terminal and a control voltage is applied to the base of the first transistor. A third resistor is connected between the emitter of the first transistor and a grounding point. A current mirror circuit draws a current proportional to a current input from the collector of the first transistor from a connection point of the first and second resistors.

8 Claims, 10 Drawing Sheets

POWER AMPLIFIER

BACKGROUND OF THE INVENTION

1. Field of the Invention

The present invention relates to a power amplifier having improved idle current controllability, reduced susceptibility to device variations and stable temperature characteristics.

2. Background Art

Power amplifiers using GaAs heterojunction bipolar transistors (GaAs-HBT) are presently used widely as power amplifiers for use in portable telephone in CDMA and other systems. FIG. 13 is a circuit diagram showing a conventional GaAs-HBT power amplifier. The area in the dotted frame in FIG. 13 corresponds to a GaAs chip. Circuit elements in the other area are formed of chip parts and conductor lines on a module substrate.

In FIG. 13, reference characters Tr1 and Tr2 denote a preceding-stage amplifying device and a following-stage amplifying device, respectively. Bias1 denotes a preceding-stage bias circuit for driving the preceding-stage amplifying device, and Bias2 denotes a following-stage bias circuit for driving the following-stage amplifying device.

Vc1 and Vc2 respectively denote collector power supply terminals of the preceding-stage and following-stage amplifying devices. Vcb denotes a power supply terminal for the bias circuits Bias1 and Bias2. Vref denotes a terminal through which a control voltage is applied to the bias circuits Bias1 and Bias2. IN denotes an RF signal input terminal. OUT denotes an RF signal output terminal. R1 to R4 denote resistors; C1 to C10, capacitors; L1 and L2, inductors; and L3 to L8, lines having particular electrical lengths and functioning as inductors. Recently, in ordinary cases, C1, C2, and L1 forming an input matching circuit and C3, C4 and L2 forming an interstage matching circuit are integrated on the GaAs chip for the purpose of reducing the module size.

FIG. 14 is a circuit diagram showing a conventional bias circuit. This bias circuit corresponds to the above-described preceding-stage bias circuit Bias1 or following-stage bias circuit Bias2. In FIG. 14, Vref denotes a terminal to which a control voltage is externally applied; Trb1 to Trb3, Trb7 and Trb8 denote GaAs-HBTs; Tr denotes an amplifying device; and Rb1 to Rb3 and Rb5 to Rb8 denote resistors.

An emitter follower circuit including Trb1 applies voltage to the base (input terminal) of the corresponding amplifying device Tr according to the control voltage. An RF signal input from a terminal RFin is input to the base of the amplifying device Tr via a capacitor C in an input matching circuit. The amplified RF signal is output from the collector of the amplifying device Tr to a terminal RFout.

This bias circuit operates so as to constantly maintain the idle current through the preceding-stage amplifying device and the following-stage amplifying device of the power amplifier with respect to changes in temperature (see, for example, Japanese Patent Laid-Open No. 2004-343244). The idle current is a bias current in the power amplifier when there is no RF input power.

FIG. 15 is a diagram showing input/output characteristics of a conventional CDMA HBT power amplifier. When the input power Pin is increased, the idle current Ictq is constant but the output power Pout increases and the total operating current Ict increases.

FIG. 16 is a diagram showing a distortion characteristic of the conventional CDMA HBT power amplifier. The distortion characteristic is expressed by the adjacent channel leakage ratio (ACLR). The ACLR increases with increase in the output power Pout. The output power Pout, power gain Gp and efficiency PAE when the output power increases determine whether the characteristic of the power amplifier is good or bad.

FIG. 17 is a diagram showing a probability distribution with respect to the output power of the power amplifier in a CDMA terminal in a suburb. The probability of low output about 0 dBm is the highest while the probability of the maximum output about 27 dBm is low (see, for example, B. Sahu and G. A. Rincon-Mora, "A high-efficiency linear RF power amplifier with a power-tracking dynamically adaptive buck-boost supply," IEEE Trans. MTT vol. 52, No. 1, pp. 112-120, January 2004). It is, therefore, desirable to enable easily obtaining the desired distortion characteristic by limiting the idle current to a small value when the output power is low and increasing the idle current when the output power is high. For example, as shown in FIG. 18, the idle current Icq of the power amplifier can be limited to the least necessary value by changing the idle current Icq according to the desired output power Pout. However, this method requires a complicated control circuit.

For this reason, a method for making selection between a high idle current and a low idle current in an analog manner according to the output power has been adapted in many cases. This method can be easily implemented if a current mirror circuit or the like is used with enhancement-mode field-effect transistors. However, there are only a small number of documents disclosing a GaAs-HBT power amplifier in which the idle current is controlling in an analog manner.

FIG. 19 is a circuit diagram showing a conventional GaAs-HBT power amplifier in which the idle current is controlled in an analog manner (see, for example, Y.-W. Kim, K.-C. Han, S.-Y. Hong, J.-H. Shin, "A 45% PAE/18 mA quiescent current CDMA/PAM with a dynamic bias control circuit," 2004 IEEE Radio Frequency Interated Circuit (RFIC) Symposium, 2004 Digest of Technical Papers, PP. 365-368). In FIG. 19, Tr denotes an amplifying device; Vc, a collector power supply terminal of the amplification stage constituted by the amplifying device Tr; Vcb, a collector power supply terminal of a bias circuit; Vref, a reference terminal to which a reference voltage is externally applied; and Vmod, a control terminal to which a control voltage is externally applied. Trb11 to Trb17 denote GaAs-HBTs. Rb11 to Rb17 denote resistors. L denotes a transmission line. C denotes a capacitor. An RF signal input from a terminal RFin is input to the base of the amplifying device Tr via the capacitor C in an input matching circuit. The amplifying device Tr amplifies the RF signal and outputs the amplified RF signal from the collector to a terminal RFout. A base circuit formed by Trb11 to Trb17 and Rb11 to Rb17 applies a voltage to the base of the amplifying device Tr according to the control voltage applied to the terminal Vmod.

The power amplifier shown in FIG. 19 has a problem that the control voltage and the idle current are in a nonlinear relationship with each other and, therefore, the controllability of the idle current is low. The amplifier also has a problem that since the idle current control function and the biasing function are incorporated in one circuit, its susceptibility to device variations is high and it is difficult to make constant the temperature characteristic of the idle current (variation in idle current with temperature with respect to the same control voltage).

SUMMARY OF THE INVENTION

The present invention has been achieved to solve the above-described problems and an object of the present invention is to provide a power amplifier having improved idle current controllability, unsusceptibility to device variations and stable temperature characteristics.

According to one aspect of the present invention, a power amplifier comprises a first amplifying device which amplifies a radiofrequency signal; a second amplifying device having an output terminal connected to an output terminal of the first amplifying device; an emitter follower circuit which applies to an input terminal of the second amplifying device a voltage according to a reference voltage applied to a reference terminal; first and second resistors connected in series between the reference terminal and an input terminal of the first amplifying device; a first transistor having its collector connected to the reference terminal, a control voltage being applied to the base of the first transistor; a third resistor connected between the emitter of the first transistor and a grounding point; and a current mirror circuit which draws out of a connection point between the first resistor and the second resistor a current proportional to a current input from the collector of the first transistor.

The present invention makes it possible to obtain a power amplifier having improved idle current controllability, unsusceptibility to device variations and stable temperature characteristics.

Other and further objects, features and advantages of the invention will appear more fully from the following description.

DETAILED DESCRIPTION OF THE PREFERRED EMBODIMENTS

First Embodiment

Figure 1:
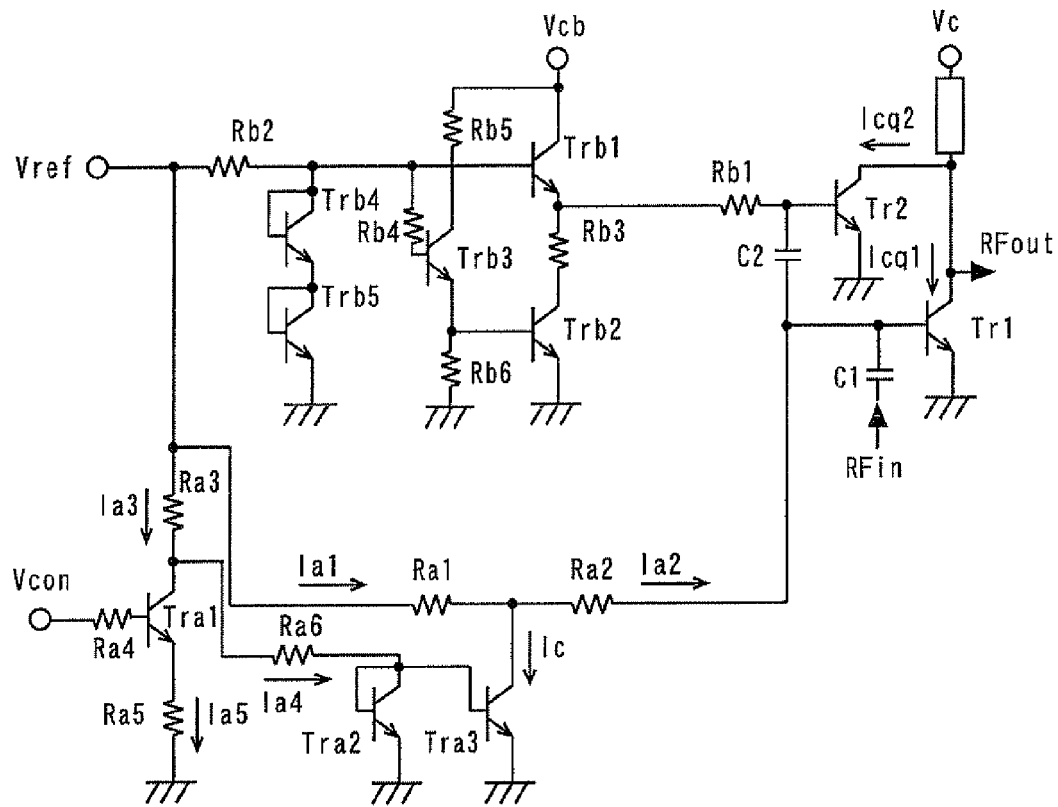
FIG. 1 is a circuit diagram showing a power amplifier according to a first embodiment of the present invention.

FIG. 1 is a circuit diagram showing a power amplifier according to a first embodiment of the present invention. Tr1 denotes a first amplifying device; Tr2, a second amplifying device; Vc, a collector power supply terminal of the amplification stage constituted by the first and second amplifying devices Tr1 and Tr2; Vcb, a collector power supply terminal of a bias circuit; Vref, a reference terminal to which a reference voltage (ordinarily 2.8 to 2.9 V) is externally applied; and Vcon, a control terminal to which a control voltage is externally applied. Trb1 to Trb5 and Tra1 to Tra3 denote GaAs-HBTs. Rb1 to Rb6 and Ra1 to Ra6 denote resistors. An input matching circuit and an output matching circuit are omitted.

An RF signal input from a terminal RFin is input to the base (input terminal) of the first amplifying device Tr1 via a capacitor C1 of the input matching circuit. The first amplifying device Tr1 amplifies the RF signal and outputs from its collector (output terminal) to a terminal RFout. The collector (output terminal) of the second amplifying device Tr2 is connected to the collector of the first amplifying device Tr1. These amplifying devices are connected to the power supply terminal Vc via a transmission line L. A capacitor C2 is connected between the base of the first amplifying device Tr1 and the base of the second amplifying device Tr2. The first amplifying device Tr1 and the second amplifying device Tr2 are thus coupled capacitively.

The emitter of Trb1 is connected to the base of Tr1 via the resistor Rb1. The base of Trb1 is connected to the reference terminal Vref via the resistor Rb2. The collector of Trb1 is connected to the power supply terminal Vcb.

The collector of Trb2 is connected to the emitter of Trb1 via the resistor Rb3. The emitter of Trb2 is grounded. The base of Trb3 is connected to the reference terminal Vref via the resistors Rb2 and Rb4. The collector of Trb3 is connected to the power supply terminal Vcb via the resistor Rb5. The emitter of Trb3 is connected to the base of Trb2 and is grounded via the resistor Rb6. The base and the collector of Trb4 are connected to the reference terminal Vref via the resistor Rb2. The base and the collector of Trb5 are connected to the emitter of Trb4. The emitter of Trb5 is grounded.

The emitter follower circuit formed by the resistors Rb3 to Rb6 and Trb1 to Trb3 applies to the base of the second amplifying device Tr2 a voltage according to the reference voltage applied to the voltage reference terminal Vref.

The first resistor Ra1 and the second resistor Ra2 are connected in series between the reference terminal Vref and the base of the first amplifying device Tr1. The collector of the first transistor Tra1 is connected to the reference terminal Vref via the resistor Ra3. The control voltage applied to the control terminal Vcon is applied to the base of the first transistor Tra1 via the resistor Ra4. The third resistor Ra5 is connected between the emitter of the first transistor Tra1 and a grounding point.

The transistor Tra2 has its base and collector connected to the collector of the first transistor Tra1 via the resistor Ra6 and has its emitter grounded. The transistor Tra3 has its base connected to the collector of the transistor Tra2, its collector connected to the connection point between the first resistor Ra1 and the second resistor Ra2, and its emitter grounded. The transistors Tra2 and Tra3 form a current mirror circuit and draw out of the connection point between the first resistor Ra1 and the second resistor Ra2 a current proportional to the current input from the collector of the first transistor Tra1. A current Ia2 is thereby caused to change linearly according to the control voltage.

When the control voltage applied to the terminal Vcon is low (at a level lower than the built-in voltage of the pn junction of GaAs, e.g., 1.2 V), the first transistor Tra1 is OFF. In this state, therefore, a current Ia3 flows through the transistor Tra2 entirely as a current Ia4. Since Tra2 and Tra3 form a current mirror, a current Ic corresponding to the mirror-multiple of the current Ia4 flows through Tra3. If the circuit constants are set so that the current Ic entirely absorbs a current Ia1, no current Ia2 flows and, accordingly, no idle current Icq1 flows.

When the control voltage applied to the terminal Vcon is high (e.g., 2.5 V), the first transistor Tra1 is turned ON. If the circuit constants are set so that when the control voltage is high the current Ia3 flows generally entirely as a current Ia5 and substantially no current Ia6 flows, no current mirror current Ic flows and the entire current Ia1 is supplied as current Ia2 to the base of the first amplifying device Tr1 to cause the idle current Icq1 to flow. In the present embodiment, however, an idle current Icq2 through the second amplifying device Tr2 is constant independently of whether the control voltage is high or low.

Figure 2:
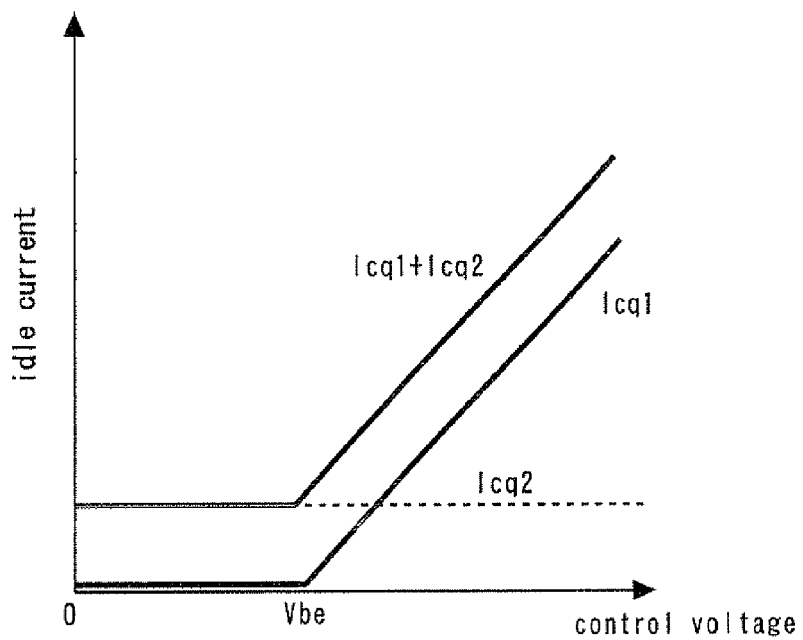
FIG. 2 shows relationship between the control voltage and the idle current according to a first embodiment of the present invention.

In the present embodiment, the idle current can be controlled in an analog manner according to the control voltage applied to the control terminal Vcon. The provision of the resistor Ra5 which is a high-resistance emitter load and Tra2 and Tra3 forming a current mirror circuit enables maintaining the control voltage and the idle current in a linear relationship with each other, as shown in FIG. 2. Thus, the controllability of the idle current is improved.

The emitter follower circuit (Rb3 to Rb6, Trb1 to Trb3) that applies a bias to the amplifying device and the circuit (Ra1 to Ra6, Tra1 to Tra3) that controls the idle current through the amplifying device are separated to ensure unsusceptibility to device variations and stable temperature characteristics.

Trb1 in the emitter follower circuit and Trb4 in the diode connection may be replaced with enhancement-mode field-effect transistors to enable reducing the reference voltage (about 2.8 to 2.9 V) to 2.0 V or less.

Second Embodiment

Figure 3:
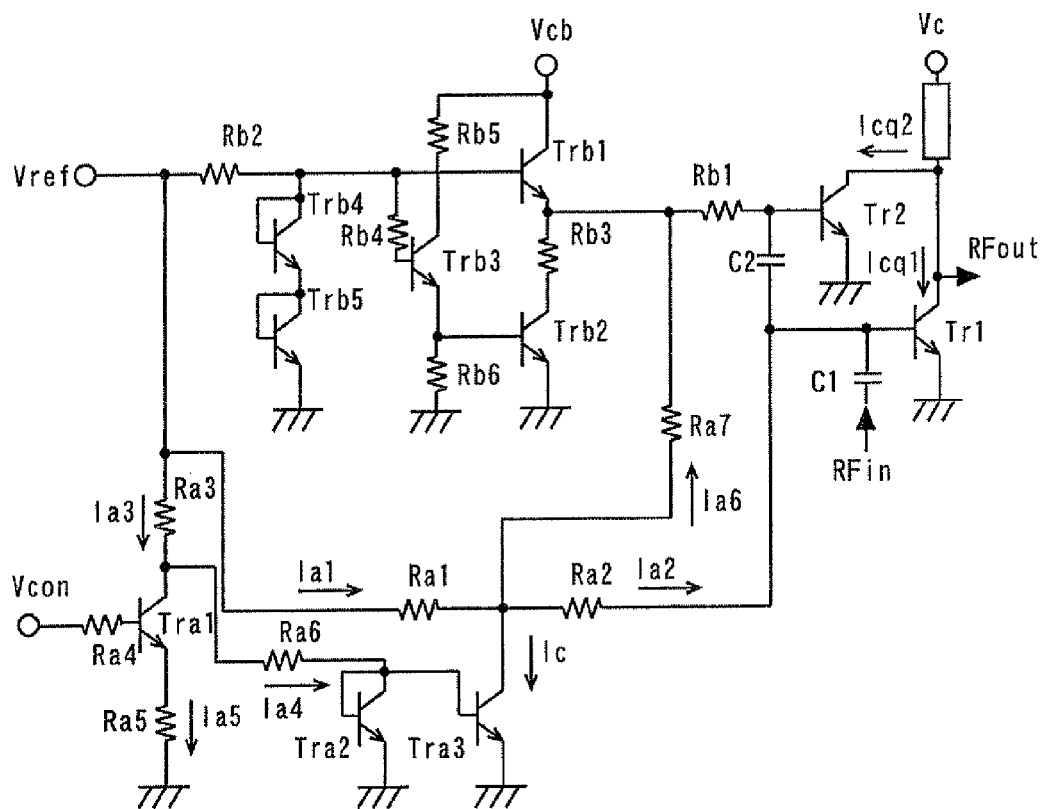
FIG. 3 is a circuit diagram showing a power amplifier according to a second embodiment of the present invention.
Figure 4:
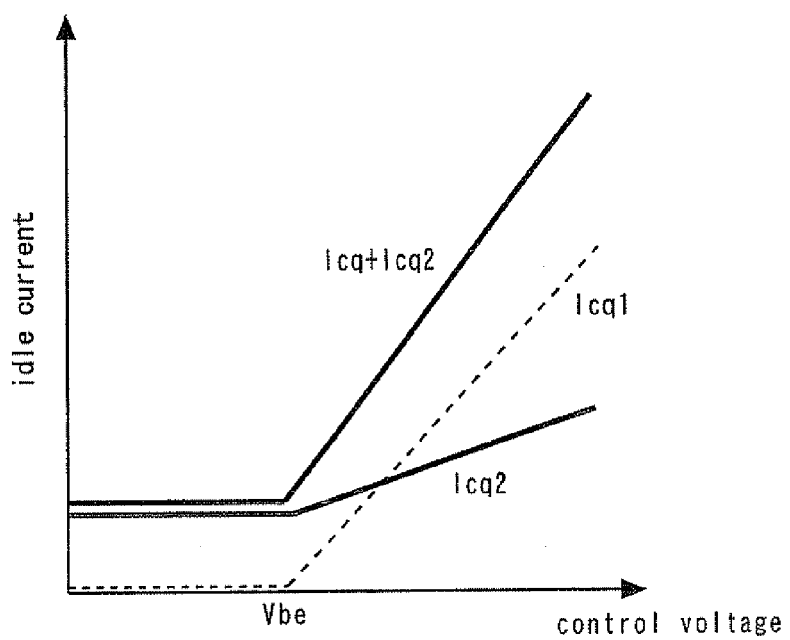
FIG. 4 shows relationship between the control voltage and the idle current according to a second embodiment of the present invention.

FIG. 3 is a circuit diagram showing a power amplifier according to a second embodiment of the present invention. A fourth resistor Ra7 is connected between the base (input terminal) of the second amplifying device Tr2 and the connection point between the first and second resistors Ra1 and Ra2. In other respects, the configuration of the second embodiment is the same as that of the first embodiment. This arrangement enables maintaining the control voltage and the idle current in a linear relationship with respect to the second amplifying device Tr2 as well as with respect to the first amplifying device Tr1, as shown in FIG. 4. Thus, the idle current through the second amplifying device Tr2 can be increased during high-output-power operation to obtain an output characteristic with reduced distortion.

Third Embodiment

Figure 5:
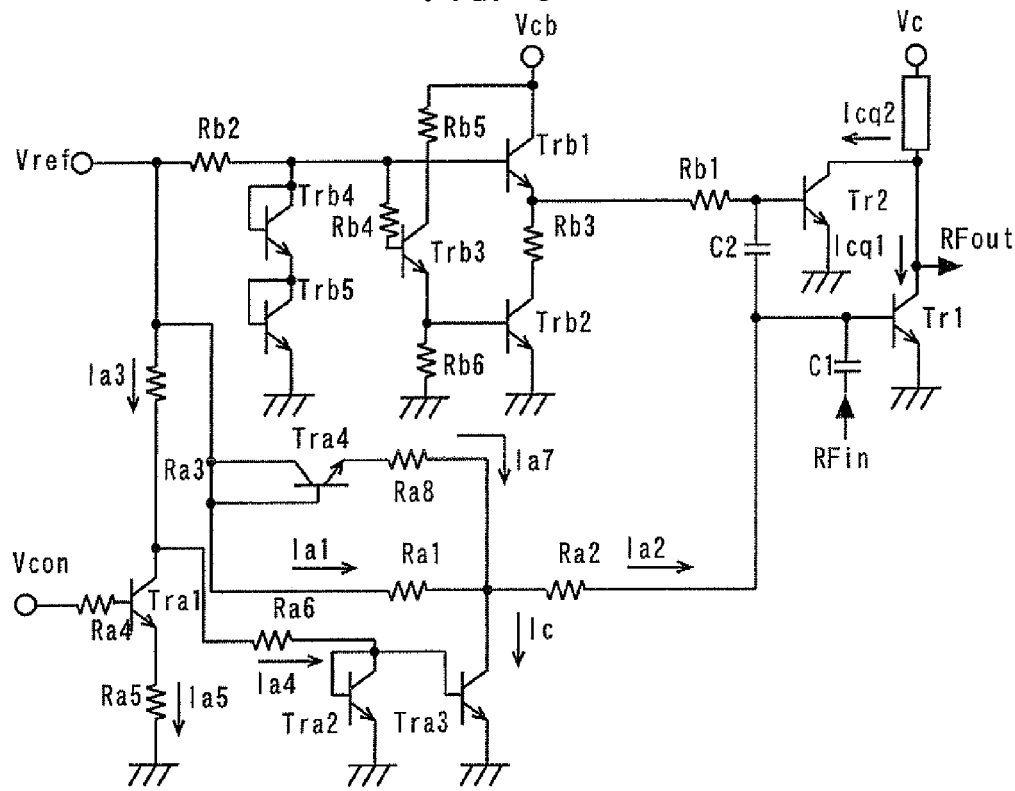
FIG. 5 is a circuit diagram showing a power amplifier according to a third embodiment of the present invention.

FIG. 5 is a circuit diagram showing a power amplifier according to a third embodiment of the present invention. The base and the collector of the second transistor Tra4 are connected to the reference terminal Vref. A fifth resistor Ra8 is connected between the emitter of the second transistor Tra4 and the connection point between the first and second resistors Ra1 and Ra2. In other respects, the configuration of the third embodiment is the same as that of the first embodiment.

In the first embodiment, if the control voltage is constant, the idle current Icq1 through the first amplifying device Tr1 is constant with respect to varying temperature. If the idle current is constant, the gain of the HBT power amplifier decreases with increase in temperature. Thus, there has been a problem that the gain of the power amplifier decreases with increase in temperature. In the third embodiment of the present invention, the idle current Icq1 through the first amplifying device Tr1 can be increased with increase in temperature. As a result, the gain of the power amplifier can be constantly maintained with respect to increase in temperature.

Fourth Embodiment

Figure 6:
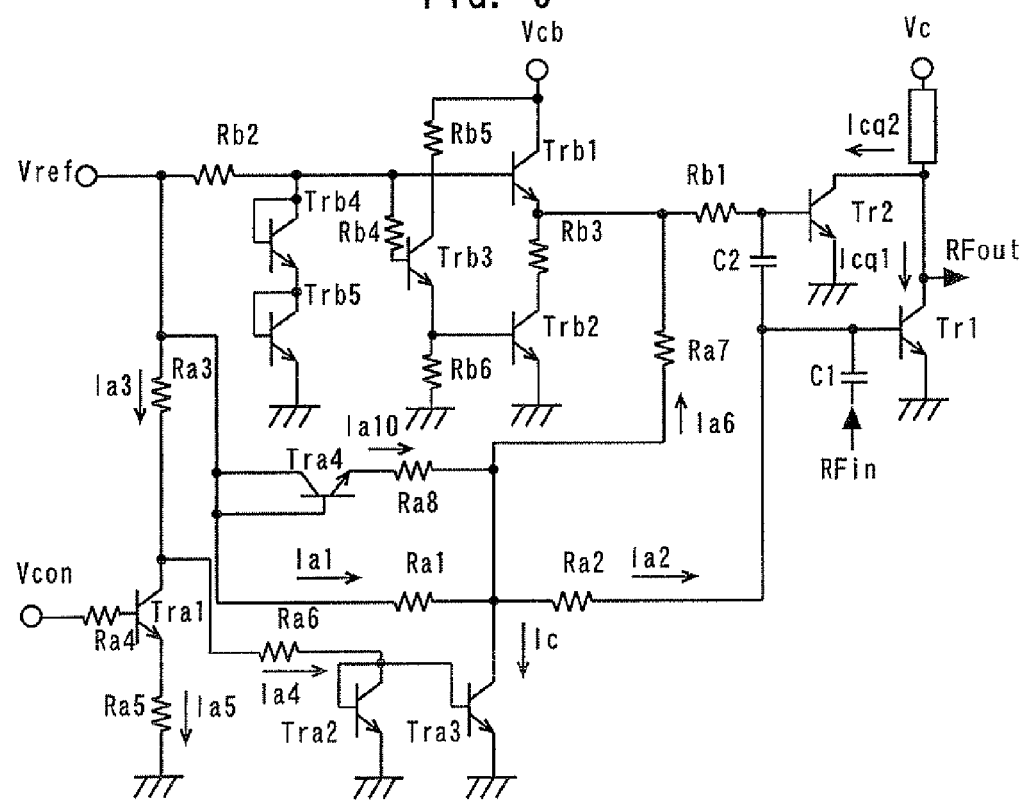
FIG. 6 is a circuit diagram showing a power amplifier according to a fourth embodiment of the present invention.

FIG. 6 is a circuit diagram showing a power amplifier according to a fourth embodiment of the present invention. A fourth resistor Ra7 is connected between the base (input terminal) of the second amplifying device Tr2 and the connection point between the first and second resistors Ra1 and Ra2. In other respects, the configuration of the fourth embodiment is the same as that of the third embodiment. With this arrangement, the effects of the first to third embodiments can be obtained.

Fifth Embodiment

Figure 7:
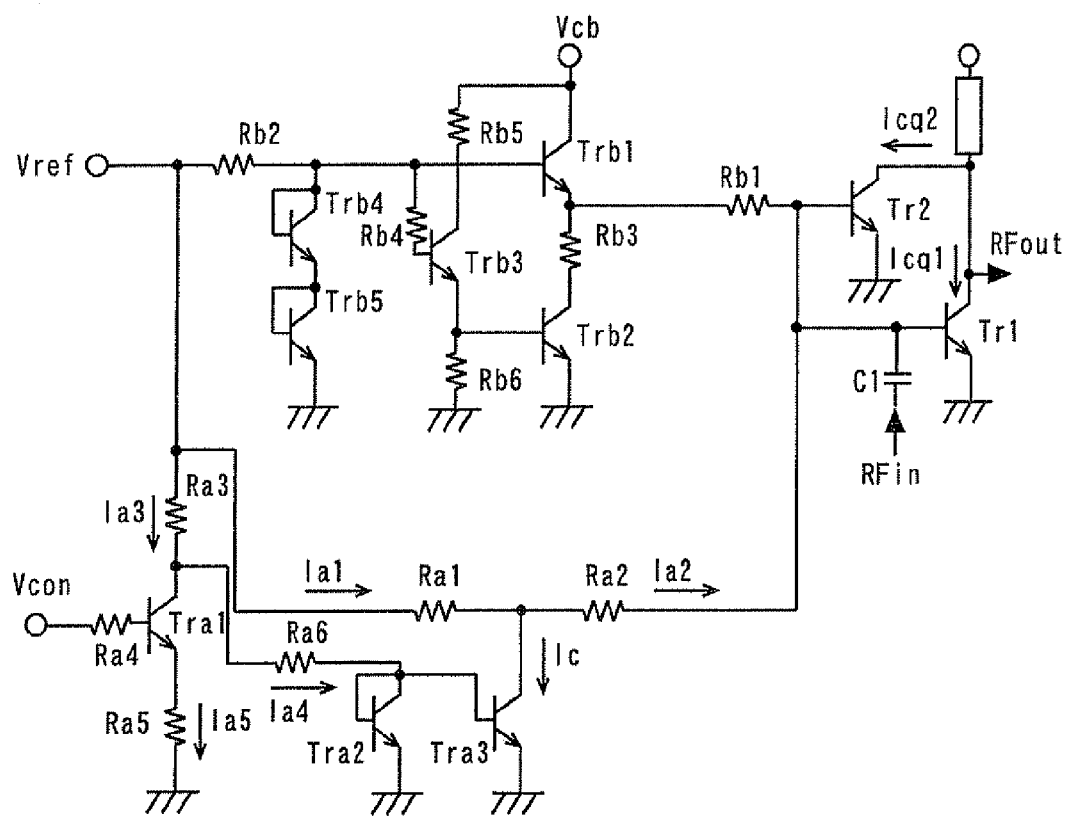
FIG. 7 is a circuit diagram showing a power amplifier according to a fifth embodiment of the present invention.
Figure 8:
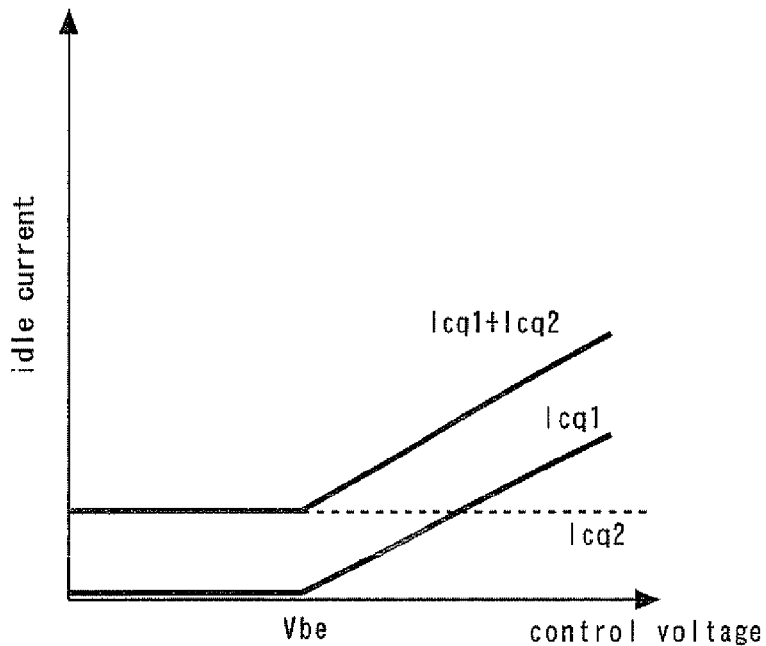
FIG. 8 shows relationship between the control voltage and the idle current according to a fifth embodiment of the present invention.

FIG. 7 is a circuit diagram showing a power amplifier according to a fifth embodiment of the present invention. The capacitor C2 is removed and the base (input terminal) of the first amplifying device Tr1 and the base (input terminal) of the second amplifying device Tr2 are short-circuited to each other. In other respects, the configuration of the fourth embodiment is the same as that of the first embodiment. The amount of control of the idle current is thereby reduced, as shown in FIG. 8. However, the circuit can be simplified (reduced in size) in comparison with the first embodiment.

Sixth Embodiment

Figure 9:
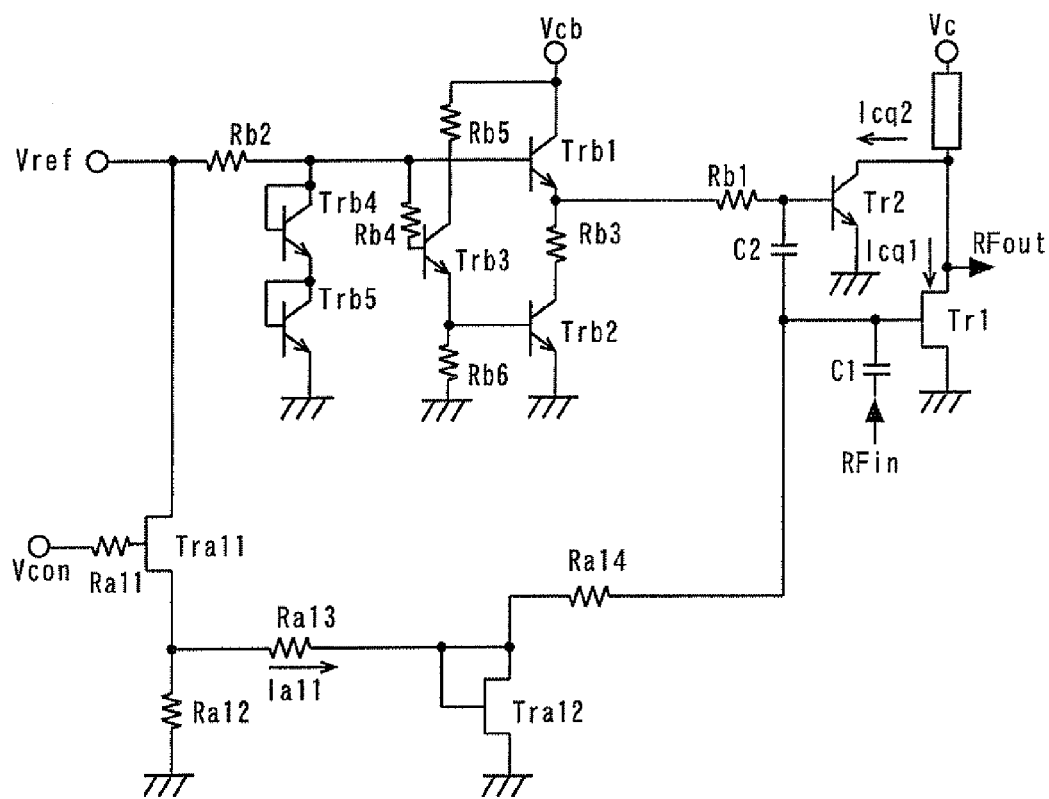
FIG. 9 is a circuit diagram showing a power amplifier according to a sixth embodiment of the present invention.

FIG. 9 is a circuit diagram showing a power amplifier according to a sixth embodiment of the present invention. The configuration of the circuit for controlling the idle current of the amplifying device in the sixth embodiment differs from that in the first embodiment. That is, the drain of a first transistor Tra11 is connected to the reference terminal. The control voltage applied to the control terminal Vcon is applied to the gate of the first transistor Tra11 via a resistor Ra11. A resistor Ra12 is connected between the source of the first transistor Trail and a grounding point. One end of a first transistor Ra13 is connected to the source of the first transistor Tra11. A second transistor Tra12 has its gate and drain connected to the other end of the first resistor Ra13, and its source grounded. A second resistor Ra14 is connected between the drain of the second transistor Tra12 and the gate (input terminal) of the first amplifying device Tr1. There is no problem even if the resistor Ra12 does not exist.

The power amplifier according to the sixth embodiment uses not a simple HBT process but a BiFFr process as its prerequisite. That is, the first amplifying device Tr1 and the first and second transistors Tra11 and Tra12 are formed of enhancement-mode field-effect transistors.

The enhancement-mode field-effect transistors have threshold voltages Vth of 0.1 to 0.2 V, lower than the built-in voltage Vb (1.2 V) at the p-n junction of GaAs. Therefore, the control voltage applied to the control terminal Vcon can be directly used as a reference current for the current mirror of Tra12 and Tr1. That is, when the control voltage is 0 V, no current Ia11 flows and, therefore, no idle current Icq1 flows through the first amplifying device Tr1. When the control voltage is high (2.5 V), the current Ia11 flows and the idle current Icq1 corresponding to the mirror-multiple of the current Ia11 flows through the first amplifying device Tr1.

Figure 10:
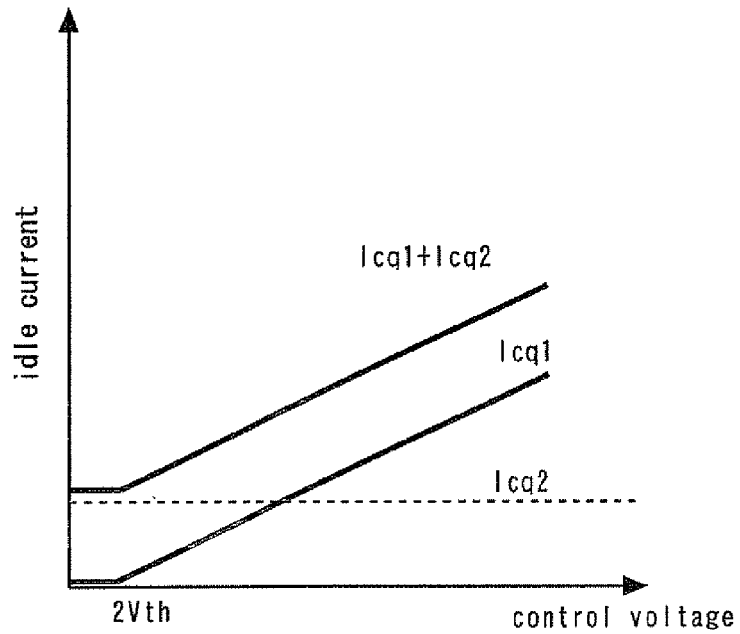
FIG. 10 shows relationship between the control voltage and the idle current according to a sixth embodiment of the present invention.

In the present embodiment, the idle current can be controlled in an analog manner according to the control voltage applied to the control terminal Vcon. Also, the current Ia11 increases linearly with increase in the control voltage and, therefore, the control voltage and the idle current can be maintained in a linear relationship with each other, as shown in FIG. 10. Thus, the controllability of the idle current is improved.

Also, the emitter follower circuit (Rb3 to Rb6, Trb1 to Trb3) that applies a bias to the amplifying device and the circuit (Ra11 to Ra14, Tra11 to Tra12) that controls the idle current through the amplifying device are separated to ensure unsusceptibility to device variations and stable temperature characteristics.

Also, enhancement-mode field-effect transistors are used in the circuit for controlling the idle current through the amplifying device, so that the minimum value of the control voltage can be reduced from Vbe (about 1.2 V) to 2Vth (about 0.2 to 0.4 V) shown in FIG. 2.

Seventh Embodiment

Figure 11:
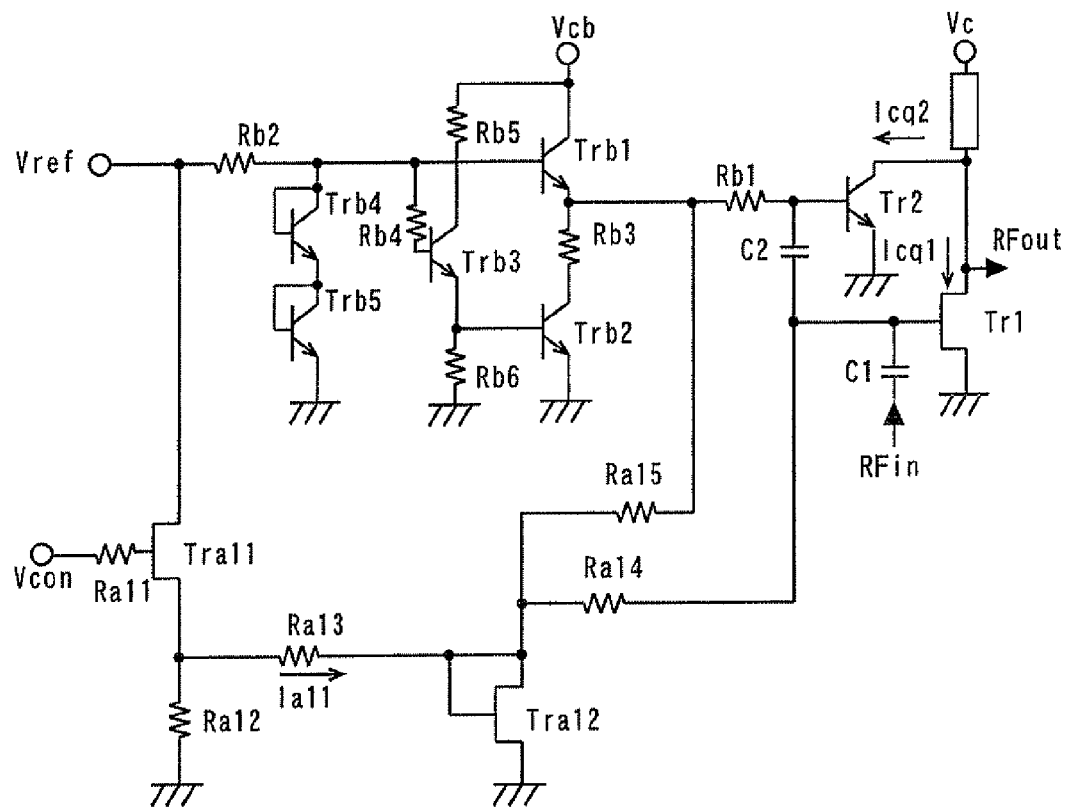
FIG. 11 is a circuit diagram showing a power amplifier according to a seventh embodiment of the present invention.
Figure 12:
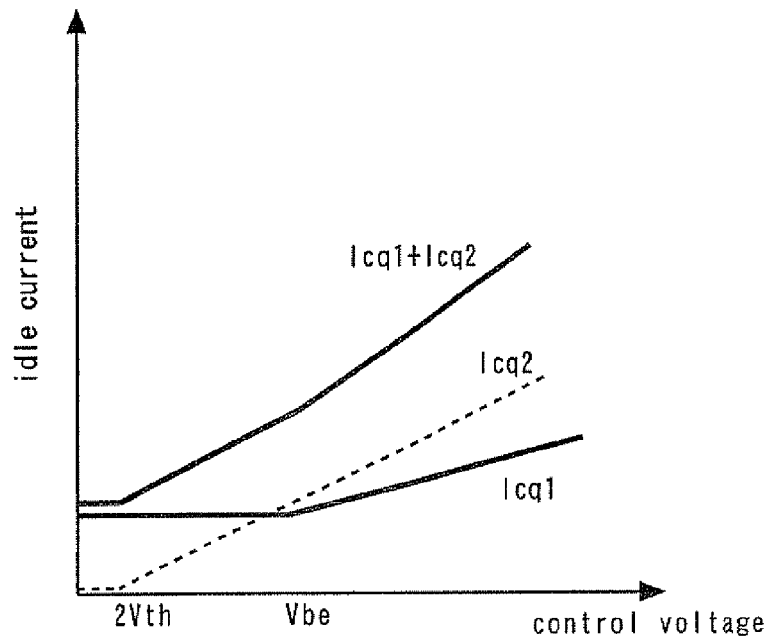
FIG. 12 shows relationship between the control voltage and the idle current according to a seventh embodiment of the present invention.
Figure 13:
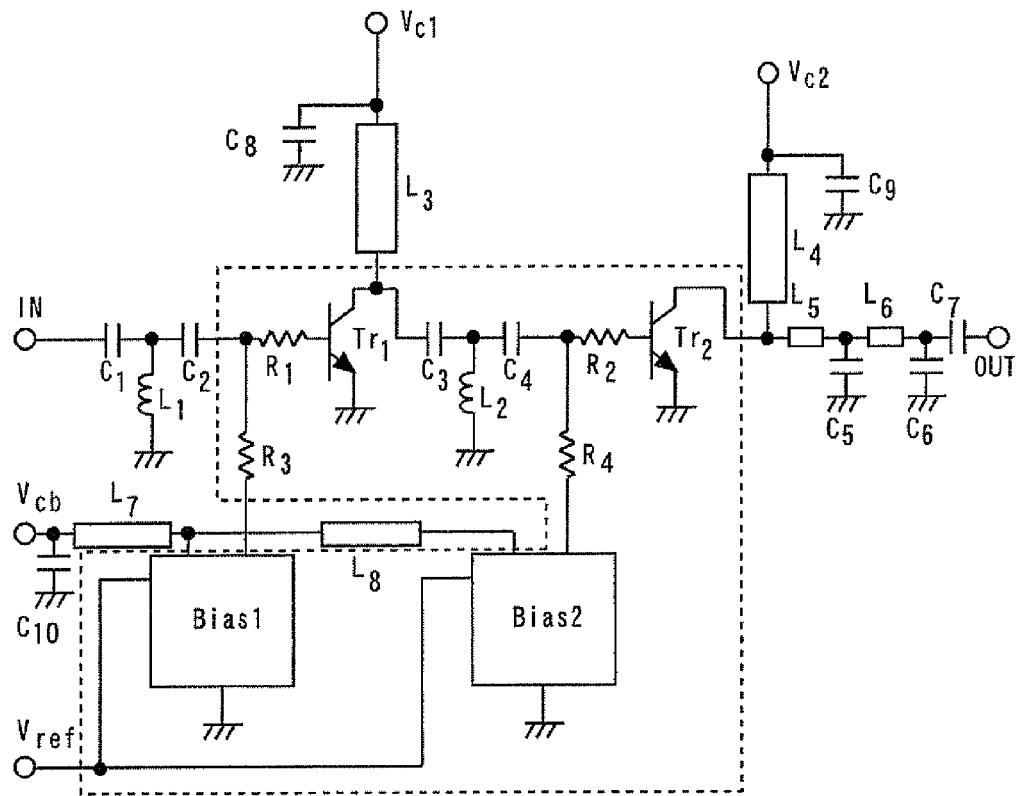
FIG. 13 is a circuit diagram showing a conventional GaAs-HBT power amplifier.
Figure 14:
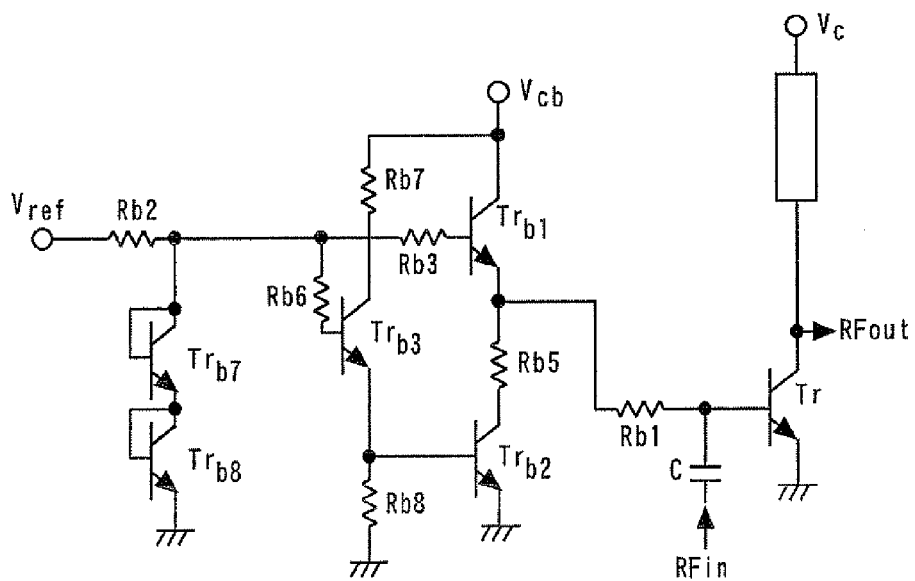
FIG. 14 is a circuit diagram showing a conventional bias circuit.
Figure 15:
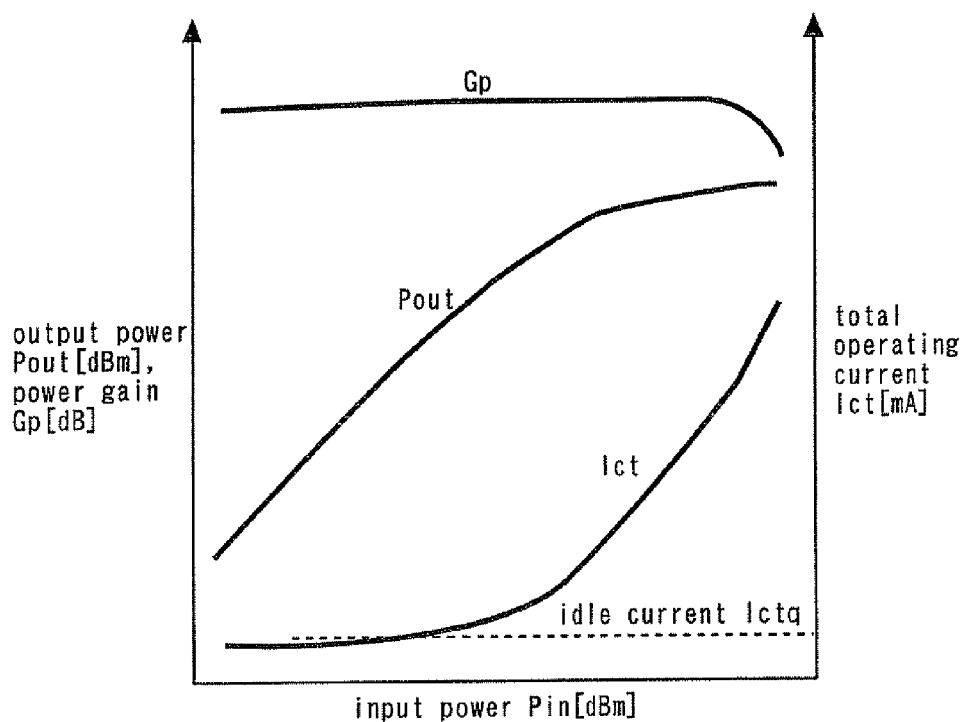
FIG. 15 is a diagram showing input/output characteristics of a conventional CDMA HBT power amplifier.
Figure 16:
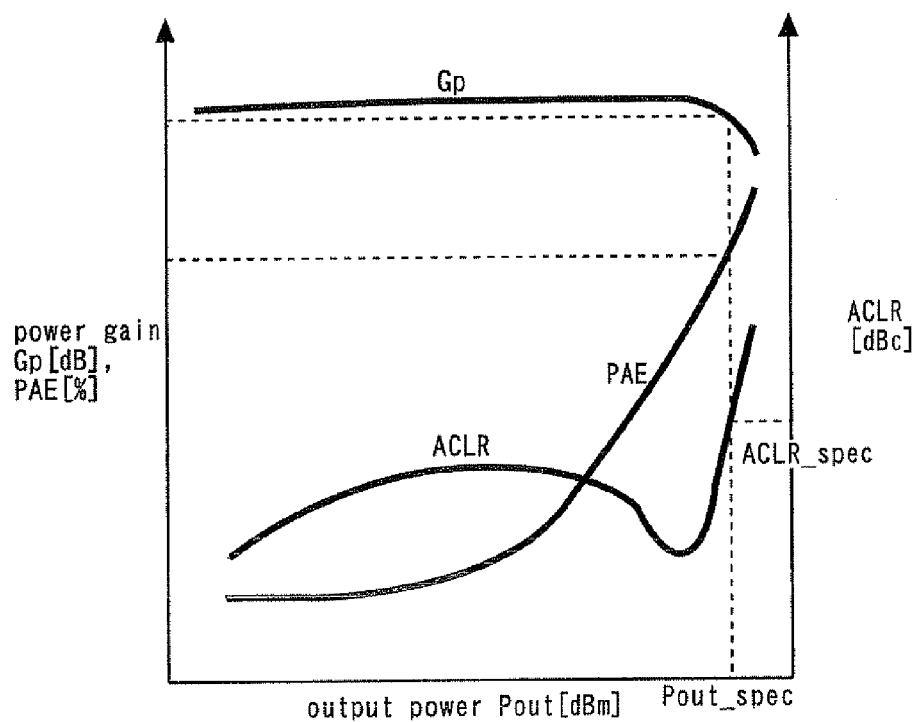
FIG. 16 is a diagram showing a distortion characteristic of the conventional CDMA HBT power amplifier.
Figure 17:
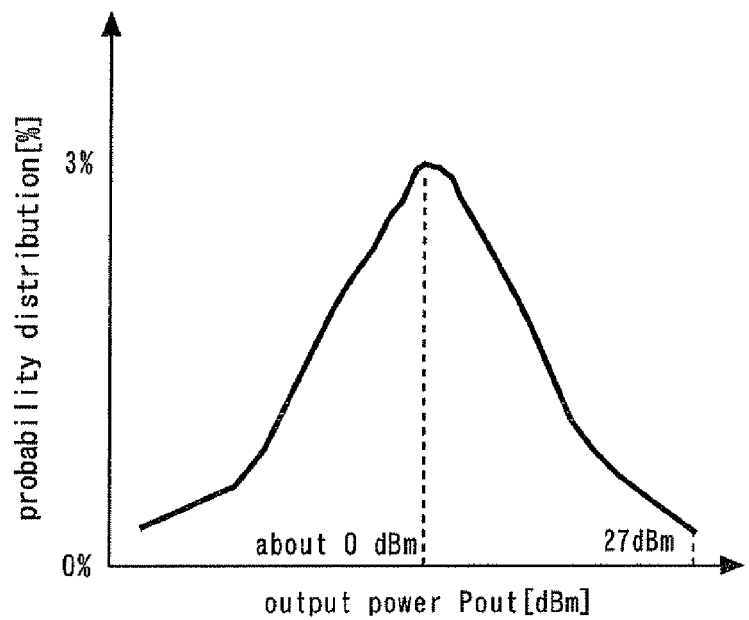
FIG. 17 is a diagram showing a probability distribution with respect to the output power of the power amplifier in a CDMA terminal in a suburb.
Figure 18:
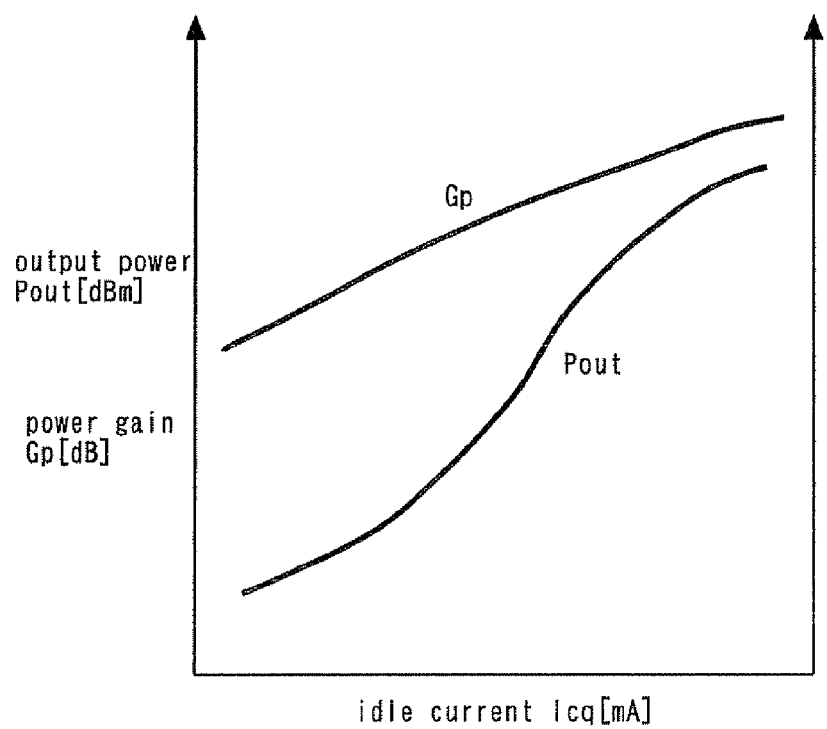
FIG. 18 is a view for explaining a method of changing the idle current according to the output power.
Figure 19:
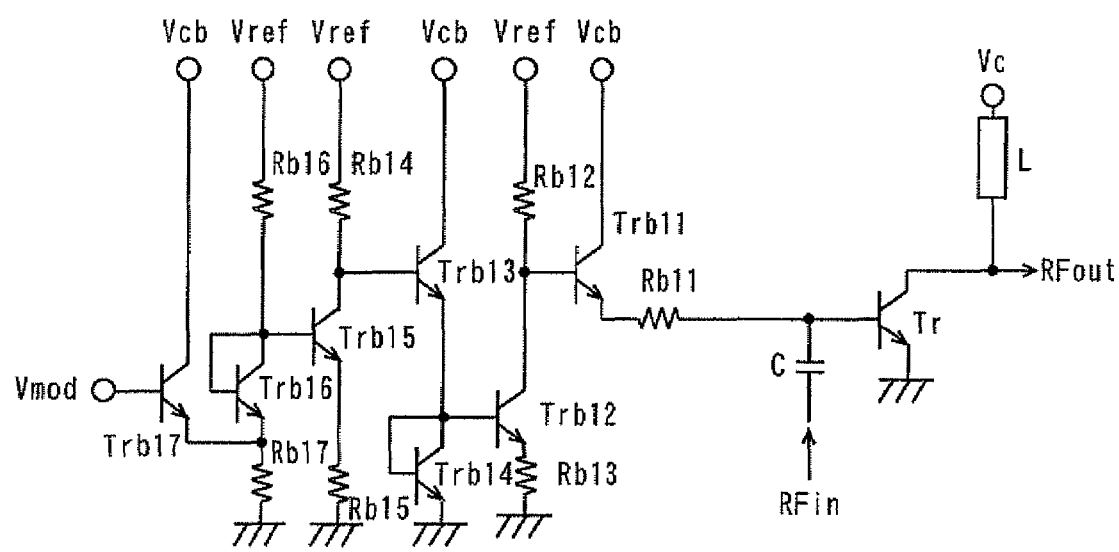
FIG. 19 is a circuit diagram showing a conventional GaAs-HBT power amplifier in which the idle current is controlled in an analog manner.

FIG. 11 is a circuit diagram showing a power amplifier according to a seventh embodiment of the present invention. A third resistor Ra15 is connected between the drain of the second transistor Tra12 and the base (input terminal) of the second amplifying device Tr2. In other respects, the configuration is the same as that in the sixth embodiment. This arrangement enables maintaining the control voltage and the idle current in a linear relationship with respect to the second amplifying device Tr2 as well as with respect to the first amplifying device Tr1, as shown in FIG. 12. Thus, the idle current through the second amplifying device Tr2 can be increased during high-output-power operation to obtain an output characteristic with reduced distortion.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-217269, filed on Aug. 23, 2007 including specification, claims, drawings and summary, on which the Convention priority of the present application is based, are incorporated herein by reference in its entirety.

What is claimed is:

1. A power amplifier comprising:
   a first amplifying device having input and output terminals and which amplifies a radio frequency signal;
   a second amplifying device having an output terminal connected to the output terminal of the first amplifying device, and an input terminal;
   an emitter follower circuit which applies to the input terminal of the second amplifying device a voltage according to a reference voltage applied to a reference terminal;
   first and second resistors connected in series between the reference terminal and the input terminal of the first amplifying device;
   a first transistor having an emitter, a collector connected to the reference terminal, and a base to which a control voltage is applied;
   a third resistor connected between the emitter of the first transistor and a grounding point; and
   a current mirror circuit which draws a current proportional to current input from the collector of the first transistor from a connection point of the first resistor to the second resistor.

2. The power amplifier according to claim 1, further comprising a fourth resistor connected between the input terminal of the second amplifying device and the connection point of the first resistor to the second resistor.

3. The power amplifier according to claim 1, further comprising:
   a second transistor having a base and a collector connected to the reference terminal, and an emitter; and a fourth resistor connected between the emitter of the second transistor and the connection point of the first resistor to the second resistor.

4. The power amplifier according to claim 1, further comprising a capacitor connected between the input terminal of the first amplifying device and the input terminal of the second amplifying device.

5. The power amplifier according to claim 1, wherein the input terminal of the first amplifying device and the input terminal of the second amplifying device are short-circuited to each other.

6. A power amplifier comprising:
   a first amplifying device having input and output terminals and which amplifies a Radio frequency signal;
   a second amplifying device having an output terminal connected to the output terminal of the first amplifying device, and an input terminal;
   an emitter follower circuit which applies to the input terminal of the second amplifying, device a voltage according to a reference voltage applied to a reference terminal;
   a first transistor having a source, a drain connected to the reference terminal, and a gate to which a control voltage is applied;
   a first resistor having a first end connected to the source of the first transistor;
   a second transistor having a gate and a drain connected to a second end of the first resistor and a source that is grounded; and
   a second resistor connected between the drain of the second transistor and the input terminal of the first amplifying device.

7. The power amplifier according to claim 1, wherein each of the first amplifying device and the first and second transistors is an enhancement-mode field-effect transistor.

8. The power amplifier according to claim 6, further comprising a third resistor connected between the drain of the second transistor and the input terminal of the second amplifying device.

* * * * *